United States Patent
Robles et al.

(10) Patent No.: US 8,504,949 B2
(45) Date of Patent: Aug. 6, 2013

(54) HYBRID HOTSPOT DETECTION

(75) Inventors: Juan Andres Torres Robles, Wilsonville, OR (US); Salma Mostafa Fahmy, Cairo (EG); Peter Louiz Rezk Beshay, Cairo (EG); Kareem Madkour, Cairo (EG); Fedor G Pikus, Bellevue, WA (US); Jen-Yi Wuu, Wilsonville, OR (US); Duo Ding, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/191,436

(22) Filed: Jul. 26, 2011

(65) Prior Publication Data

US 2013/0031518 A1    Jan. 31, 2013

(51) Int. Cl.
*G06F 17/50* (2006.01)
(52) U.S. Cl.
USPC .......................................................... 716/52
(58) Field of Classification Search
USPC .......................................................... 716/52
See application file for complete search history.

(56) References Cited

U.S. PATENT DOCUMENTS

| | | | |
|---|---|---|---|
| 8,214,772 B2 * | 7/2012 | Liu et al. | 716/52 |
| 2006/0271906 A1 * | 11/2006 | Tang et al. | 716/21 |
| 2006/0273266 A1 * | 12/2006 | Preil et al. | 250/548 |
| 2007/0256725 A1 * | 11/2007 | Fork et al. | 136/246 |
| 2007/0266352 A1 * | 11/2007 | Cheng et al. | 716/4 |
| 2007/0288219 A1 * | 12/2007 | Zafar et al. | 703/14 |
| 2009/0300561 A1 * | 12/2009 | Tong et al. | 716/5 |
| 2010/0324878 A1 * | 12/2010 | Lee et al. | 703/14 |
| 2011/0231804 A1 * | 9/2011 | Liu et al. | 716/54 |
| 2012/0216156 A1 * | 8/2012 | Liu et al. | 716/52 |

* cited by examiner

*Primary Examiner* — Suresh Memula

(57) ABSTRACT

Aspects of the invention relate to hybrid hotspot detection techniques. The hybrid hotspot detection techniques combine machine learning classification, pattern matching and process simulation. A machine learning model, along with false hotspots and false non-hotspots for pattern matching, is determined based on training patterns. The determined machine learning model is then used to classify patterns in a layout design into three categories: preliminary hotspots, preliminary non-hotspots and potential hotspots. Pattern matching is then employed to identify false positives and false negatives in the first two categories. Process simulation is employed to identify boundary hotspots in the last category.

17 Claims, 5 Drawing Sheets

HYBRID HOTSPOT DETECTION

FIELD OF THE INVENTION

The present invention is directed to integrated circuit (IC) physical design verification. Various aspects of the invention may be particularly useful for detecting hotspots in a layout design.

BACKGROUND OF THE INVENTION

Overview

For the past few years, modern IC industry has been steadily following Moore's Law. As the shrinking of device feature sizes brings advantages such as reduction of circuit switching power and manufacturing cost, it is also accompanied by the problem of prolonged manufacturability closure. Printing sub-wavelength features results in serious resolution degradation, which affects a product's yield and reliability. Locations in a design where layout geometries will be printed with dimensions over or below specified threshold values are often referred to as lithographic hotspots or hotspots. Two common categories of the hotspots are pinching and bridging.

Traditionally, appropriate rules are checked at various design stages (e.g., design rule checking, or "DRC") to improve layout printability. DRC attempts to prevent printing imperfections by imposing geometric constraints on a layout design. In their original form, geometrical rules are one-dimensional and their capability of describing two-dimensional patterns is limited. As the rules are expanded to cover more complicated two-dimensional patterns, they either become overly conservative, or too relaxed to catch some hotspot patterns.

Resolution enhancement techniques (RET) such as the addition of sub-resolution assist features (SRAF) and optical proximity correction (OPC) can further improve layout printability. However, these techniques cannot completely resolve some printability problems. Accordingly, a model-based lithography simulation (or process simulation) is performed on the full design to capture a few undetected hotspots before tape-out. The model-based lithography simulation has been the golden standard for physical verification methods. However, this great accuracy comes at a price of high computational complexity and runtime. Thus, chip-scale lithography simulations are usually reserved for final safeguarding steps before tape-out.

Since the majority of hotspots can be eliminated through layout modifications, lithographic hotspot detection are typically embedded into the early design phases where the cost of layout tuning is cheaper. Pattern matching-based hotspot detection tools have been accepted in the industry. They are capable of efficiently scanning design layouts for undesirable patterns learned from previous experience. A major drawback of these tools, however, is their inability to detect bad patterns that will cause printability problems but that are absent from the database of undesirable patterns. With fuzzy matching algorithms, detection coverage can be improved. However, such approaches are still largely ineffective in detecting previously unseen hotspot patterns.

Recently, supervised machine learning techniques, such as those based on artificial neural networks and on support vector machines, have been applied to the field of hotspot detection. A supervised machine learning technique builds a classification or regression model using a set of training pattern samples with given class labels. The model is then used to predict the class labels of test samples. These machine learning techniques are capable of identifying hotspot test patterns unknown to the trained model. However, challenges remain in improving their detection accuracy and efficiency.

BRIEF SUMMARY OF THE INVENTION

Aspects of the invention relate to hybrid hotspot detection techniques. The hybrid hotspot detection techniques combine machine learning classification, pattern matching and process simulation. With various implementations of the invention, a machine learning model is calibrated based on training patterns. In addition to the machine learning model, false hotspots and false non-hotspots that will be used for pattern matching are identified based on the machine learning classification of the training patterns.

To identify hotspots in a layout design, layout patterns may be extracted first. These layout patterns are first classified using the calibrated machine learning model. Three classes of patterns may be derived: preliminary hotspots, preliminary non-hotspots and potential hotspots. For some layout designs, there may be no potential hotspots. Pattern matching is employed to identify false positives (i.e. non-hotspots that are classified as preliminary hotspots) and false negatives (i.e. hotspots that are classified as preliminary non-hotspots) based on the false hotspots and the false non-hotspots determined during the model calibration process. Process simulation (or lithography simulation) is employed to identify hotspots (boundary hotspots) in the potential hotspots. Hotspot information for the layout design may then be determined based on the preliminary hotspots, the preliminary non-hotspots, the false positives, the false negatives and the boundary hotspots.

DETAILED DESCRIPTION OF THE INVENTION

Figure 1:
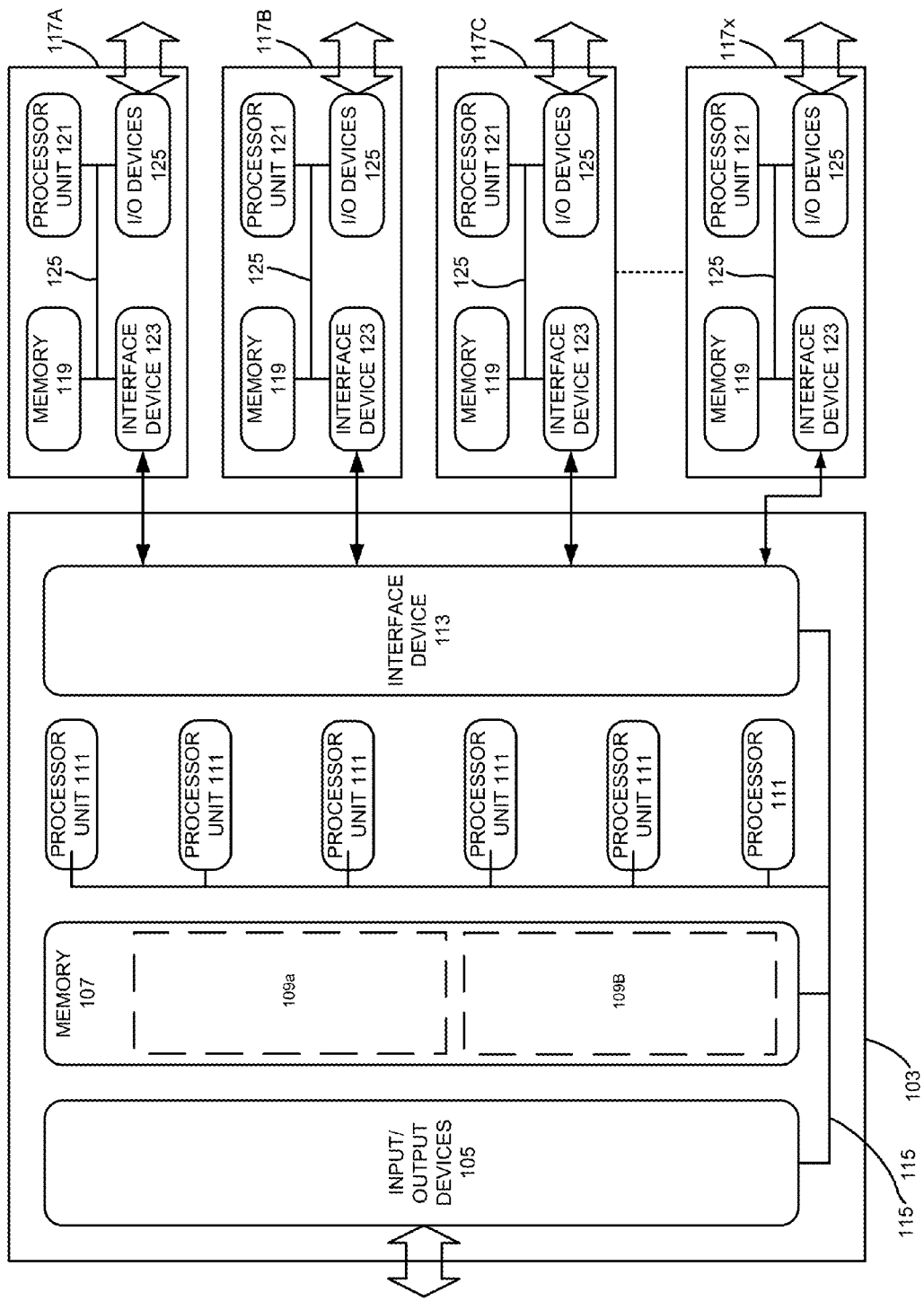
FIG. 1 illustrates a programmable computer system with which various embodiments of the invention may be employed.

Various aspects of the present invention relate to hotspot detection techniques. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine," "identify," "classify," "calibrate" and "create" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Exemplary Operating Environment

The execution of various electronic design automation processes may be implemented using computer-executable software instructions executed by one or more programmable computing devices. Because these examples of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or slave computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
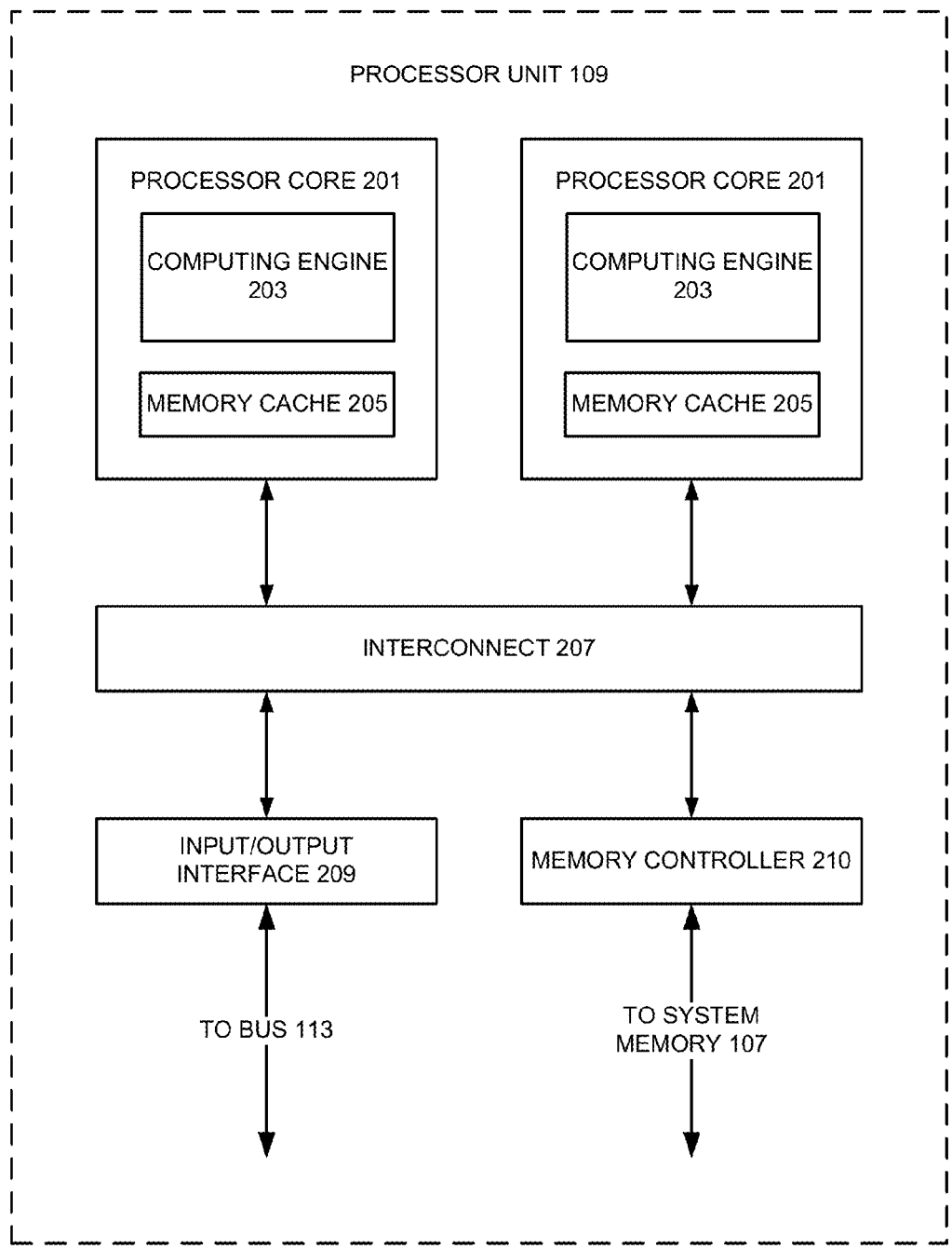
FIG. 2 illustrates a process for scan chain diagnosis in accordance with an embodiment of the present invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the invention may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 117 may alternately or additions be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Hybrid Hotspot Detection

As mentioned earlier, the three hotspot detection approaches, process simulation, pattern matching and machine learning, all have their limitations. Among the three, the process simulation-based approach has the highest detection accuracy but is the most computationally intensive. The pattern matching-based approach is the fastest in terms of runtime but inefficient in detecting hotspots that do not match any of the known hotspot patterns. While the machine learning-based approach does not have such limitations and is much faster than the process simulation-based approach, it may not be as efficient in detecting previously known hotspot patterns as the pattern matching-based approach. To take advantage of the advantages for each approach while reducing the impact of their limitations, various embodiments of the invention combine the three hotspot detection approaches into a hybrid approach of hotspot detection. This hybrid approach starts with supervised machine learning classification of layout features.

In general, supervised machine learning methods seek to derive a function $f: X \rightarrow Y$, where $X \in R^n$ and $Y \in R$, where $X$ is a set of given samples, or training set. The derived function $f$, often referred to as machine learning classifier, maps from the features of input samples (X) to a class label (y) (i.e. predicting the class label of test samples). The lithographic hotspot pattern prediction problem is usually formulated as a two-class classification problem. The class label of any sample may assume one of the two possible values, e.g. 1 and −1, which represent hotspots and non-hotspots, respectively. The process of constructing machine learning classifiers from the training set is referred to as training (or model calibration/creation), while the process of class label prediction of test samples is referred to as testing (or hotspot detection in this application).

Figure 3:
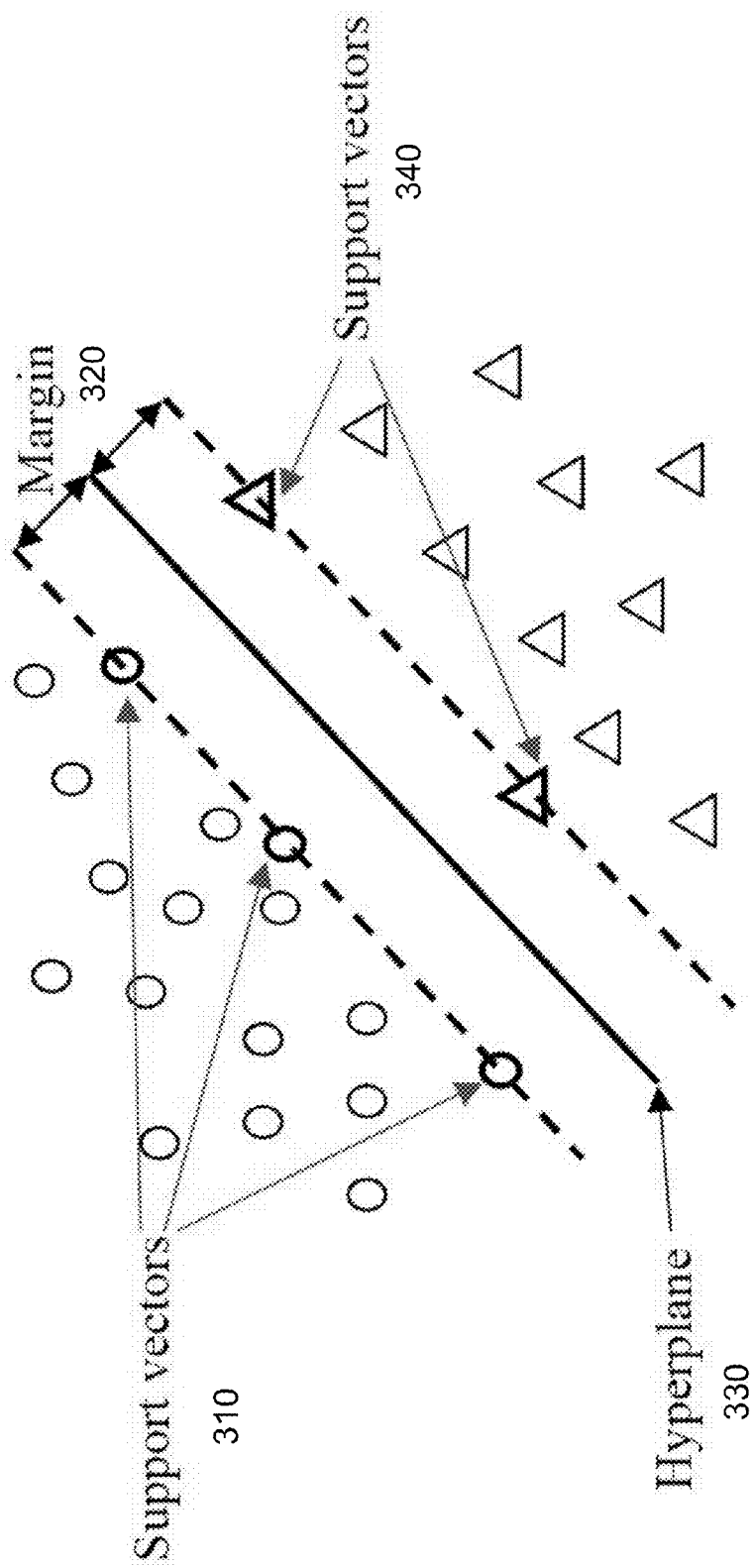
FIG. 3 illustrates an example of classification by support vector machines.

As noted earlier, supervised machine learning methods include the artificial neural network methods and the support vector machine (SVM) methods. The support vector machine methods map the training data into a higher dimensional space where the different classes can be separated by a hyper plane, which is illustrated as feature 330 in FIG. 3. This hyper plane 330 is specified by a subset of its training samples called support vectors (310 and 340 in FIG. 3). An SVM separation hyper plane is derived by maximizing its margin 320 from the training data points of different classes, which generally lowers the generalization error of the resulting classifier.

For example, given a set of training data points, $T=\{x_i, y_i\}$, where $x_i \in R^n$ and $y_i \in \{1, -1\}$ for $i=1, \ldots, k$, the binary C-SVM classification method solves the following optimization problem:

$$\min_{w,b,\xi} \left( \frac{1}{2} w^T w + C \sum_{i=1}^{k} \xi_i \right) \qquad (1)$$

$$s.t. \ y_i(w^T \phi(x_i) + b) \geq 1 - \xi_i, \xi_i \geq 0, i = 1, \ldots, k$$

The solution of the optimization problem defines a hyperplane $w \cdot x + b = 0$ separating the classes. Minimizing the first term, $$\frac{1}{2} w^T w,$$

corresponds to maximizing the margin between the two classes. The second term, $$C \sum_{i=1}^{k} \xi_i,$$

introduces soft margins that account for mislabeled data points that may cause the hyperplane to not be able to perfectly separate the classes. This formulation results in hyperplanes that separate the two classes as cleanly as possible. In addition, the kernel function $K(x_i, x_j) \equiv \phi(x_i)^T \phi(x_j)$ is used as a similarity metric between two input vectors $x_i$ and $x_j$. With various implementations of the invention, the radial basis function, $K(x_i, x_j) = \exp(-\gamma \|x_i - x_j\|^2)$, where $\gamma > 0$, is used.

The above formulation attempts in part to solve the problem of "over-fitting" a limited number of training data points. As a result, some of the training data points that are known to be hotspots may be labeled by the created machine learning model as non-hotspots (false non-hotspots) and some of the training data points that are non-hotspots may be labeled as hotspots (false hotspots). It should be noted that the existence of such false hotspots and false non-hotspots is not limited to the binary C-SVM classification method.

Various embodiments of the invention first employ a machine learning method to classify test patterns. The machine learning method may adopt but is not limited to the support vector machine techniques. Methods disclosed in U.S. patent application Ser. No. 13/191,433, entitled "Hotspot Detection Based On Machine Learning," which application is incorporated entirely herein by reference, may also be used.

The classification result obtained by the machine learning method comprises preliminary hotspots and preliminary non-hotspots. Then a pattern matching method is used to identify false negatives (hotspots that are falsely identified as non-hotspots) and false positives (non-hotspots that are falsely identified as hotspots) from the preliminary hotspots and preliminary non-hotspots. Rather than using all known hotspot patterns for pattern matching, false non-hotspots and false hotspots derived during the model calibration phase are employed. The size of the two databases is usually not large, so adding a pattern matching process can improve the hotspot detection accuracy without significantly slowing the whole hotspot detection process.

Some test data points may lie so close to the hyperplane that classifying them as either hotspots or non-hotspots using the machine learning model may not be meaningful. In various embodiments of the invention, the machine learning model will classify these outliers as a class of potential hotspots in addition to the two other classes, the preliminary hotspots and the preliminary non-hotspots. A process simulation process may then be applied to identify hotspots from this class of patterns. The identified hotspots are referred to as boundary hotspots. Again, due to the limited number of potential hotspots, the application of the accurate process simulation process should not affect the speed of the whole hotspot detection process too much. It should be noted that in some cases, the machine learning model may find no potential hotspots from a test set of features and the process simulation process needs not to be performed.

Based on the preliminary hotspots and the preliminary non-hotspots identified by the machine learning approach, the false positives and the false negatives identified by the pattern matching approach, and the boundary hotspots identified by the process simulation approach, the final hotspot information can be readily derived. In the following sections, details of the machine learning model creation and the hybrid hotspot detection will be given by using a model creation system and a hybrid hotspot detection system constructed according to various embodiments of the invention.

Model Calibration System

Figure 4:
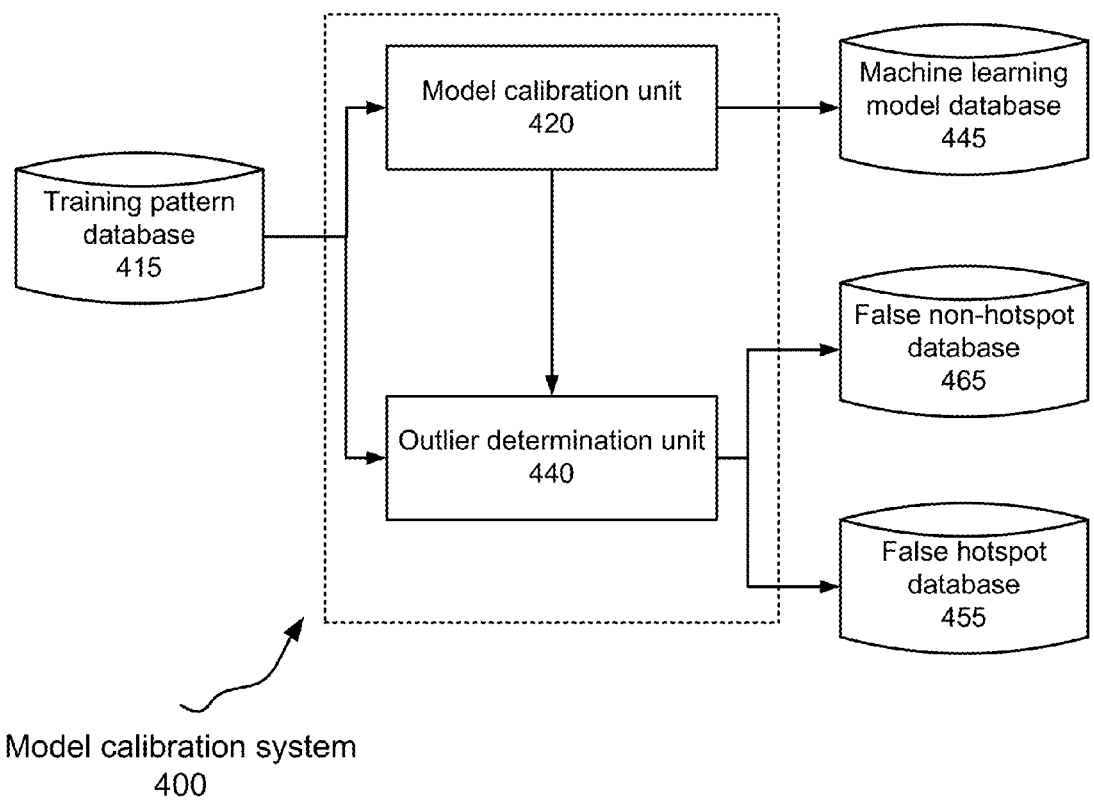
FIG. 4 illustrates an example of a model calibration system in accordance with an embodiment of the present invention.

FIG. 4 illustrates an example of a model calibration system 400 that may be provided according to various embodiments of the invention. As seen in this figure, the model calibration system 400 includes a model calibration unit 420 and an outlier determination unit 440. As will be discussed in more detail below, some implementations of the model calibration system 400 may cooperate with (or incorporated) one or more of a training pattern database 415, a machine learning model database 445, a false hotspot database 455, and a false non-hotspot database 465.

According to some embodiments of the invention, one or both of the model calibration unit 420 and the outlier determination unit 440 may be implemented by one or more computing systems, such as the computing system illustrated in FIG. 1 and FIG. 2, executing programmable instructions. Correspondingly, some other embodiments of the invention may be implemented by software-executable instructions, stored on a computer-readable medium, for instructing a computing system to perform functions of one or both of the model calibration unit 420 and the outlier determination unit 440. The computer-readable medium may be, for example, a magnetic storage device, an optical storage device, a "punched" surface type device, or a solid state storage device. While the training pattern database 415, the machine learning model database 445, the false hotspot database 455 and the false non-hotspot database 465 are shown as separate units in FIG. 4, a single computer-readable medium may be used to implement some or all of these databases.

For ease of understanding, model calibration methods that may be employed according to various embodiments of the invention will be described with reference to the model calibration system 400 illustrated in FIG. 4. It should be appreciated, however, that alternate implementations of a model calibration system 400 may be used to perform the model calibration methods according to various embodiments of the invention. Likewise, the model calibration system 400 may be employed to perform other model calibration methods according to various embodiments of the invention.

With various implementations of the invention, the model calibration unit 420 is configured to derive a machine learning model based on a set of training patterns (learning patterns). The set of training patterns may be extracted from a layout design in which hotspot locations have been identified previously. The hotspot locations may be identified by a process simulation or any other means. The locations where the hotspots are not found may be designated as non-hotspot locations. Training patterns can be extracted from these hotspot and non-hotspot locations using various means such as the unique pattern processing technique.

Support vector machine models are employed in some embodiments of the invention. The support vector machine models require the training and testing samples to be represented by one-dimensional (1D) vectors in the feature space. A transformation (or characterization) procedure may be applied to the two-dimensional (2D) layout patterns and convert them into 1D vectors. The procedure is sometimes referred to as feature encoding. One of the feature encoding methods may be used is based on pattern densities. Each of the training patterns is characterized by a grayscale bitmap. The bitmap is then converted to a 1D vector. These 1D vector-represented training patterns can be used to create a machine learning model. The created machine learning model may be stored in the machine learning model database 445.

Once a machine learning model is created, the outlier determination unit 440 is employed to determine false hotspots and false non-hotspots from the training patterns. In general, the classification accuracy of a machine learning model does not reach 100% due to various reasons including problems related to the training samples, mathematical approximation and so on. Some hotspots may be classified as non-hotspots by the machine learning model and some non-hotspots may be classified as hotspots. This may be true even when a machine training model is applied back to the training samples. One reason for it is to prevent over-fitting problems and to increase prediction accuracy. The outlier determination unit 440 applies the created machine learning model to its own training patterns and determines false identified hotspots (false hotspots) and false identified non-hotspots (false non-hotspots). The false hotspots may be stored in the false hotspot database 455. The false non-hotspots may be stored in the false non-hotspot database 465.

The selection of training patterns may affect the quality of the machine learning model. One selection problem is that a large number of training patterns are selected from a small region of the feature space, i.e. these training patterns are close in the sense of their characterization vector. To overcome this problem, a sampling threshold may be introduced that specifies a minimum distance in the feature space between the training samples.

Another selection problem is associated with the hotspot-to-non-hotspot ratio. Usually, the number of hotspots in a full layout design is small. The training samples with dominant non-hotspots can severely affect the prediction accuracy of the machine learning model. A balanced hotspot-to-non-hotspot ratio such as 1:10 may be used. In addition, non-hotspot training patterns may need to be selected from locations far from hotspot locations.

Hybrid Hotspot Detection System

Figure 5:
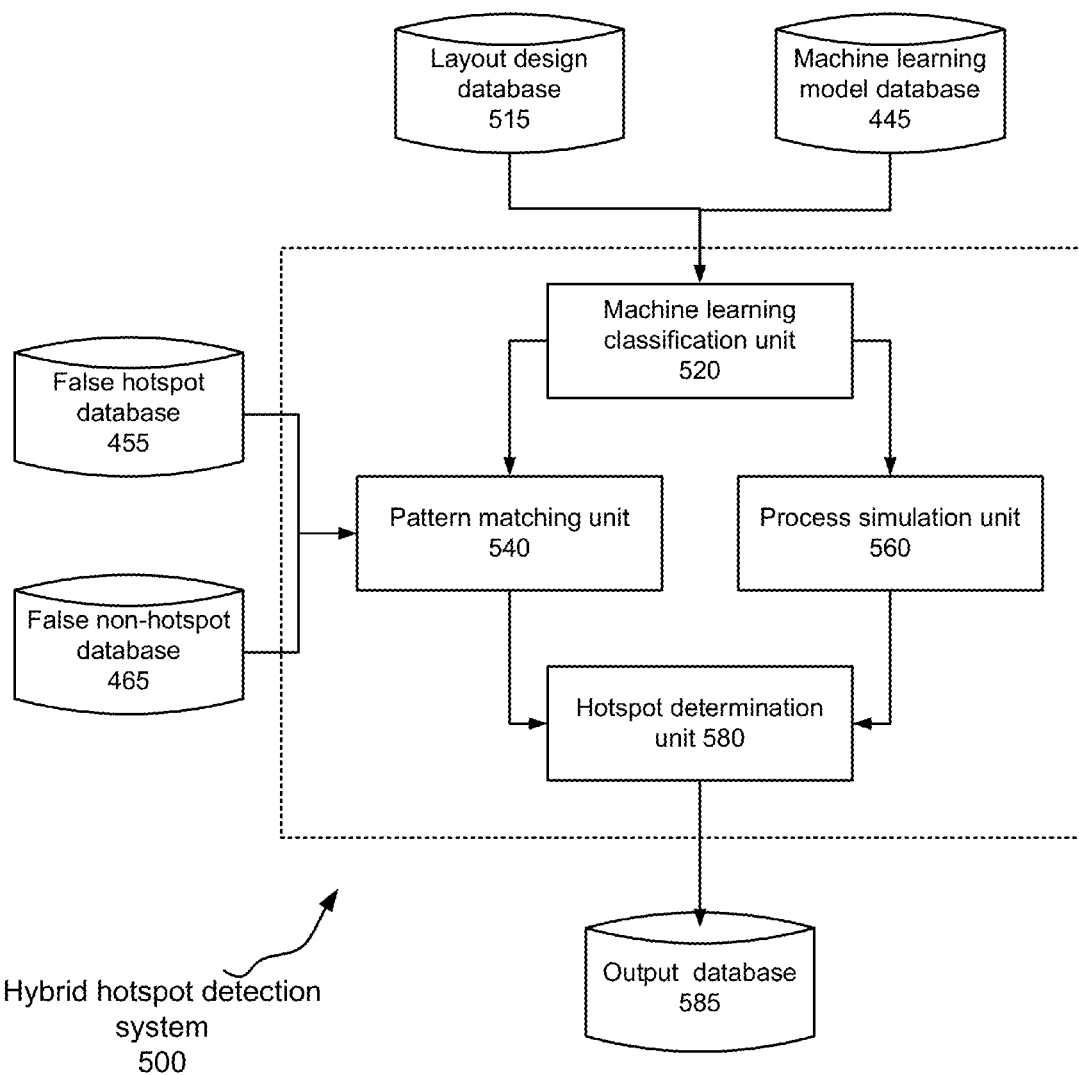
FIG. 5 illustrates an example of a hybrid hotspot detection system in accordance with an embodiment of the present invention.

FIG. 5 illustrates an example of a hybrid hotspot detection system 500 that may be provided according to various embodiments of the invention. As seen in this figure, the hybrid hotspot detection system 500 includes a machine learning classification unit 520, a pattern matching unit 540, a process simulation unit 560, and a hotspot determination unit 580. As will be discussed in more detail below, some implementations of the hybrid hotspot detection system 500 may cooperate with (or incorporated) one or more of a layout design database 515, a machine learning model database 445, a false hotspot database 455, a false non-hotspot database 465, and an output database 585.

According to some embodiments of the invention, one or more of the machine learning classification unit 520, the pattern matching unit 540, the process simulation unit 560 and a hotspot determination unit 580 may be implemented by one or more computing systems, such as the computing system illustrated in FIG. 1 and FIG. 2, executing programmable instructions. Correspondingly, some other embodiments of the invention may be implemented by software-executable instructions, stored on a computer-readable medium, for instructing a computing system to perform functions of one or more of the machine learning classification unit 520, the pattern matching unit 540, the process simulation unit 560 and a hotspot determination unit 580. The computer-readable medium may be, for example, a magnetic storage device, an optical storage device, a "punched" surface type device, or a solid state storage device. While the layout design database 515, the machine learning model database 445, the false hotspot database 455, the false non-hotspot database 465 and the output database 585 are shown as separate units in FIG. 5, a single computer-readable medium may be used to implement some or all of these databases.

For ease of understanding, hybrid hotspot detection methods that may be employed according to various embodiments of the invention will be described with reference to the hybrid hotspot detection system 500 illustrated in FIG. 5. It should be appreciated, however, that alternate implementations of a hybrid hotspot detection system 500 may be used to perform the hybrid hotspot detection methods according to various embodiments of the invention. Likewise, the hybrid hotspot detection system 500 may be employed to perform other hybrid hotspot detection methods or in other configurations may be used to perform methods according to various embodiments of the invention different from those described below.

With various implementations of the invention, the machine learning classification unit 520 is configured to classify layout patterns (or test patterns) using a machine learning model. The machine learning model may be received from the machine learning model database 445, which is derived by the model calibration system 400 as described above. The layout patterns may be extracted from a layout design that needs to be checked or verified for hotspots. According to some embodiments of the invention, to extract layout patterns, anchors may be inserted based on discontinuities of the layout features and layout patterns may be extracted from areas near/surround the anchors. The areas where the discontinuities occur are usually susceptible to printability problems. Similar to the model calibration, an encoding procedure such as the one based on pattern densities may be applied to characterize the layout patterns for machine learning classification.

Rather than always separating the layout patterns into two classes, hotspots and non-hotspots, the machine learning classification unit 520 uses three categories, preliminary hotspots, preliminary non-hotspots and potential hotspots according to various embodiments of the invention. This may be accomplished by using a pre-determined value that defines the distance between the preliminary hotspot and preliminary non-hotspot classes in the feature space for the machine learning model. Patterns that are in this region are assigned to the potential hotspot class. The pre-determined value may be set to zero, then only two classes will be derived. For some layout designs, it is possible that all layout patterns are classified into either the preliminary hotspot class or the preliminary non-hotspot class and no potential hotspots are found.

The pattern matching unit 540 is configured to search for outliers in the preliminary hotspots and preliminary non-hotspots identified by the machine learning classification unit 520. The outliers include false positives (non-hotspots that are classified as hotspots) and false negatives (hotspots that are classified as non-hotspots). The false hotspots and false non-hotspots may be received from the false hotspot database 455 and the false non-hotspot database 465, which are derived by the model calibration system 400 as described above. Various pattern matching tools may be employed such as those in the Calibre family of software tools available from Mentor Graphics Corporation, Wilsonville, Oreg.

The process simulation unit 560 is configured to identify hotspots (boundary hotspots) in the potential hotspots identified by the machine learning classification unit 520. As discussed earlier, process simulation is more accurate compared to machine learning classification and pattern matching. Even though it is slow, process simulation does not significantly affect the speed of the whole process because the number of potential hotspots is limited. By adjusting the predetermined value for the spacing between the preliminary hotspots and the preliminary non-hotspots, the number of potential hotspots and thus the simulation time may be changed. Various process simulation tools may be employed such as those in the Calibre family of software tools available from Mentor Graphics Corporation, Wilsonville, Oreg.

The hotspot determination unit 580 is configured to determine hotspot information based on the preliminary hotspots, the preliminary non-hotspots, the false positives, the false negatives and the boundary hotspots determined by the previous three units. This operation may be performed instead by the pattern matching unit and the 540 process simulation unit 560. The pattern matching unit 540 can move the identified false positives from the preliminary hotspots to the preliminary non-hotspots, and move the identified false negatives from the preliminary non-hotspots to the preliminary hotspots. The process simulation unit 560 can also add the identified boundary hotspots to the preliminary hotspots and add the rest of the potential hotspots to the preliminary non-hotspots.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. A method of hybrid hotspot detection, executed by at least one processor of a computer, comprising:
    receiving data of layout patterns of a layout design;
    classifying the layout patterns as preliminary hotspots, preliminary non-hotspots and potential hotspots based on machine learning;
    identifying false positives in the preliminary hotspots and false negatives in the preliminary non-hotspots based on pattern matching; and identifying boundary hotspots in the potential hotspots based on process simulation.

2. The method recited in claim 1, further comprising:

determining hotspot information for the layout design based on the preliminary hotspots, the preliminary non-hotspots, the false positives, the false negatives and the boundary hotspots; and storing the hotspot information in a tangible processor-accessible medium, or displaying the hotspot information on a tangible medium.

3. The method recited in claim 1, wherein the machine learning comprises a support vector machine model.

4. The method recited in claim 3, wherein the support vector machine model is derived by a model calibration system.

5. The method recited in claim 1, wherein the potential hotspots is determined by using a predetermined value that defines a separation between hotspots and non-hotspots in a feature space.

6. The method recited in claim 1, wherein the pattern matching is based on false hotspots and false non-hotspots determined by a model calibration system.

7. The method recited in claim 1, wherein the machine learning comprises encoding layout patterns based on pattern densities.

8. A hybrid hotspot detection system, comprising:

a machine learning classification unit configured to classify layout patterns as preliminary hotspots, preliminary non-hotspots and potential hotspots using a machine learning model;

a pattern matching unit configured to identify false positives in the preliminary hotspots and false negatives in the preliminary non-hotspots; and a process simulation unit configured to identify boundary hotspots in the potential hotspots.

9. The hybrid hotspot detection system recited in claim 8, further comprising:

a hotspot determination unit configured to determine hotspot information based on the preliminary hotspots, the preliminary non-hotspots, the false positives, the false negatives and the boundary hotspots.

10. The hybrid hotspot detection system recited in claim 8, wherein the machine learning model is a support vector machine model.

11. The hybrid hotspot detection system recited in claim 8, wherein the pattern matching unit employs false hotspots and false non-hotspots determined by a model calibration system for pattern matching.

12. The hybrid hotspot detection system recited in claim 8, wherein the potential hotspots is determined by using a predetermined value that defines a separation between hotspots and non-hotspots in a feature space.

13. One or more non-transitory computer-readable media storing computer-executable instructions for causing one or more processors to perform a method, the method comprising:

receiving data of layout patterns of a layout design;

classifying the layout patterns as preliminary hotspots, preliminary non-hotspots and potential hotspots based on machine learning;

identifying false positives in the preliminary hotspots and false negatives in the preliminary non-hotspots based on pattern matching; and identifying boundary hotspots in the potential hotspots based on process simulation.

14. The one or more non-transitory computer-readable media recited in claim 13, wherein the method further comprises:

determining hotspot information for the layout design based on the preliminary hotspots, the preliminary non-hotspots, the false positives, the false negatives and the boundary hotspots; and storing the hotspot information in a tangible processor-accessible medium, or displaying the hotspot information on a tangible medium.

15. The one or more non-transitory computer-readable media recited in claim 13, wherein the machine learning comprises a support vector machine model.

16. The one or more non-transitory computer-readable media recited in claim 13, wherein the potential hotspots is determined by using a predetermined value that defines a separation between hotspots and non-hotspots in a feature space.

17. The one or more non-transitory computer-readable media recited in claim 13, wherein the pattern matching is based on false hotspots and false non-hotspots determined by a model calibration system.

* * * * *